United States Patent [19]
König et al.

[11] Patent Number: 6,079,913
[45] Date of Patent: Jun. 27, 2000

[54] CUTTING TOOL, PROCESS FOR COATING A CUTTING TOOL AND USE THEREOF

[75] Inventors: Udo König, Essen; Ralf Tabersky, Bottrop; Hartmut Westphal, Dermbach, all of Germany

[73] Assignee: Widia GmbH, Essen, Germany

[21] Appl. No.: 09/068,201

[22] PCT Filed: Nov. 13, 1996

[86] PCT No.: PCT/DE96/02188

§ 371 Date: May 1, 1998

§ 102(e) Date: May 1, 1998

[87] PCT Pub. No.: WO97/19778

PCT Pub. Date: Jun. 5, 1997

[30] Foreign Application Priority Data

Nov. 24, 1995 [DE] Germany ............... 195 43 748

[51] Int. Cl.⁷ .................................................. B23B 27/14
[52] U.S. Cl. .................... 407/119; 407/120; 407/118; 428/698
[58] Field of Search ............................ 407/118, 119; 51/309; 408/144, 145; 427/248.1, 249, 250; 428/698

[56] References Cited

U.S. PATENT DOCUMENTS

| | | | |
|---|---|---|---|
| 4,853,196 | 8/1989 | Koshida et al. | 423/290 |
| 5,053,365 | 10/1991 | Shore et al. | 501/96 |
| 5,223,337 | 6/1993 | Van Den Berg et al. | 407/119 X |
| 5,286,533 | 2/1994 | Komatsu et al. | . |
| 5,299,892 | 4/1994 | Pickert | 407/119 X |
| 5,364,209 | 11/1994 | Santhanam et al. | 407/119 |
| 5,624,766 | 4/1997 | Moriguchi et al. | 407/119 X |

FOREIGN PATENT DOCUMENTS

| | | |
|---|---|---|
| 2 236 074 | 2/1974 | Germany . |
| 30 47 888 A1 | 7/1982 | Germany . |
| 242 431 A1 | 1/1987 | Germany . |
| 38 10 237 A1 | 10/1988 | Germany . |
| 39 19 307 A1 | 12/1989 | Germany . |
| 38 41 731 C1 | 4/1990 | Germany . |
| 40 20 200 C2 | 1/1991 | Germany . |
| 298 003 | 1/1992 | Germany . |
| 41 08 367 C1 | 8/1992 | Germany . |
| 93 07 394 U | 9/1993 | Germany . |
| 43 22 544 C1 | 3/1995 | Germany . |
| 44 02 287 A1 | 8/1995 | Germany . |
| 195 17 119 A1 | 11/1995 | Germany . |
| 57-174453 | 10/1982 | Japan . |
| 0006970 | 1/1983 | Japan ................. 407/119 |
| 0030406 | 1/1990 | Japan ................. 407/119 |
| 406170611 | 6/1994 | Japan ................. 407/119 |
| WO 87/06273 | 10/1987 | WIPO . |

OTHER PUBLICATIONS

"Wenn das Umfeld stimmt . . . " by Abel, published in Industrie–Anzeiger 86/1990.
"Eigenschaften und Anwendungen von Cermet–Schneidplatten" by Urano et al., published in Werkstatt 7 Betrieb 118/1985/9.
"Beschichtete Umformwerkzeuge . . . " by K. Keller et al. published in Bander Bleche Rohre Jul. 1991.
"CVD–Beschichtung bei Mitteltemperaturen" by Mathesius et al., published in Industrie–Anzeiger No. 31 of 17.4 1985/107.
"Hartstoffbeschichten von Werkzeugen" by K. Herden, published in Technische Rundschau No.36–1993.
"Polykritsalline Diamant—und Bornitrid–Werkzeuge" by Schwaighofer et al., published in Prazisions–Fertigungstechnik Sep. 1985.
"Boron nitride coating of cutting tools" by Morita et al., Chemical Abstracts 117 (1992) No. 2, Columbus, OH, US.
"Mit passenden Schneidstoffen innovativ fertigen" (VDI–Z 132 (1990) No. 3, Mar. 1987.
"Infrared spectroscopic investigantion on h–BN and mixed h/c–BN thin films" by Jager et al. (2194 Thin Solid Films 245(1994) Jun. 1, Nos. 1/2 Lausanne, CH.

*Primary Examiner*—Andrea L. Pitts
*Assistant Examiner*—Henry W. H. Tsai
*Attorney, Agent, or Firm*—Herbert Dubno

[57] ABSTRACT

A cutting tool for chip removal machining is composed of hard metal, cermet or ceramic as a sutrate coated with a surface coating being composed of both hexagonal and amorphous boron nitrides. At least an outer most coating is being composed of boron nitrides a thickness of between 1 and 5 $\mu$m. The surface has a total thickness which does not exceed 20 $\mu$m and at least 20 volume % of the outermost coating is composed of hexagonal boron nitride. The infrared spectrum of the outermost boron nitride layer has absorption lines the wave numbers at 800 to 1400 cm$^{-1}$.

4 Claims, No Drawings

CUTTING TOOL, PROCESS FOR COATING A CUTTING TOOL AND USE THEREOF

CROSS REFERENCE TO RELATED APPLICATIONS

This application is a national phase of PCT/DE96/02188 filed Nov. 13, 1996 and based, in turn, upon German national application 195 43 478.9 of Nov. 24, 1995 under the International Convention.

FIELD OF THE INVENTION

The invention relates to a cutting tool, especially for chip-removal machining, comprised of a hard-metal substrate body, ceramic substrate body, or cermet substrate body, which is coated with a surface coating. The invention also relates to a process for coating this cutting tool as well as to the use of this cutting tool.

BACKGROUND OF THE INVENTION

Aside from uncoated cutting tools of hard metals, cermets or ceramics, coated cutting inserts have developed into considerable significance in metal machining. It is known, for example, to provide shaped bodies which are comprised of at least the carbide of tungsten, titanium, niobium and tantalum, as well as metallic cobalt, as the binder, whereupon one or more surface layers can be applied by CVD, PVD or plasma CVD processes. These can be comprised of hard carbides, nitrides or carbonitrides of the elements titanium, zirconium or hafnium, or also of aluminum oxide.

It is especially known also to provide multilayer coatings of the layer sequence TiC, Ti(C,N), and TiN, optionally with an outer $Al_2O_3$ layer. With such coated cutting tools, high machining rates and long working lives can be achieved when in turning, milling or boring of the workpiece a lubricating liquid is supplied for corresponding cooling. The cooling lubricant liquid uses mainly an aqueous emulsion whose main component, namely water to 95% effects the requisite cooling of the cutting edge. The emulsified or solubilized additives are necessary to supply the requisite lubrication during the machining process, for resisting corrosion and to protect the workpiece against chemical attack. It is a drawback of the mentioned additives that they are environmentally unfriendly. Indeed it has been found that toxic additives like chloroparaffins or benzotriazol should be replaced by less environmentally hazardous substances and simultaneously that the recycling or disposal of the cooling lubricant, are associated with not insignificant costs which may not be overcome as a consequence of the increased machining efficiency and the higher useful lives of the tools.

From an economical viewpoint it is advantageous to operate without a cooling lubricant in a dry mode and to be satisfied with a higher tool wear. This latter approach is largely practiced for example with short-chip workpieces like those of cast steel. With long-chip steels, the removed chip contacts the cutting tool over a large region and because of the increased contact area at the cutting wedge of the cutting tool, increased heat development arises from friction. A solution known in the art is to provide low-friction coatings of the cutting tool, for example of aluminum oxide, to minimize the cutting tool wear. This approach does not provide general satisfaction when the operation uses a cooling lubricant.

In EP 0 634 905 B1 it is proposed to provide workpieces with "soft" layers of a chalcogenide compound like molybdenum disulfide or molybdenum diselenide. Such layers can only be produced by means of a costly PVD process and increase, because of reduced abrasion resistance, the useful life of the cutting tool in the case of steel machining only marginally.

OBJECT OF THE INVENTION

It is an object of the present invention to provide a surface-coated cutting tool which, even without a cooling lubricant, supplies a satisfactory machining rate and life.

SUMMARY OF THE INVENTION

Surprisingly it has been found that thin surface coating of both hexagonal and amorphous boron nitride can significantly improve life of cutting inserts in dry cutting.

Boron nitride can be available in several modifications. One of these modifications is cubic boron nitride (CBN) or polycrystalline cubic boron nitride (PCB). CBN has a crystal structure which has a very high hardness (Vickers hardness of 4000 to 6000). This cubic modification corresponds to that known from diamonds and results when boron nitride is pressed under high temperatures (1500 to 1700° C. and high pressure ($5 \times 10^{10}$ Pa (like that for production of synthetic diamonds)). As has already been indicated in WO 93/04015, it has been known for some time not only to use monoblocks of PCBN as tool materials themselves or as inlays for brazing on a tool support, but also to apply CBN as a surface coating on a cutting tool substrate body. The disadvantage of a tool composed of PCBN is especially that in the finish-machining of workpieces of hard ferrous materials and with small-chip cross sections, significant cutting wear arises so that dimensions, shape and surface end qualities cannot be maintained. This disadvantageous effect is primarily associated with the high-thermal conductivity of tools comprised of PCBN or CBN.

It is known, in this connection, from JP 61-41768, to deposit, while avoiding a closed layer, individual cubic boron nitride crystals on a hard metal alloy, a cermet or a ceramic substrate in a height of 0.1 to 10 $\mu$m and to fill in the boron-nitride-free interstices with carbides, nitrides, carbonitrides, borides, boron nitrides, oxides and oxicarbides of the IVa to VIa elements, hexagonal BN, amorphous BN and $Al_2O_3$. The resulting cutting efficiency is however unsatisfactory, especially because of the different thermal expansion coefficients of the coating materials, like for example boron nitride and $Al_2O_3$, which can give rise to thermal stresses upon cooling which lead to crack formation. The cubic boron nitride particles of this surface layer tend under stress to break off. To overcome this drawback, WO 93/0415 proposes a tool with a surface layer of CBN or PCBN onto which a thin layer of one or more metal oxides can be coated, which is comprised for example of at least one oxide of the metals magnesium, yttrium, titanium, zirconium or aluminum.

By contrast, the outer surface layer of the invention is comprised of hexagonal and amorphous boron nitride. Hexagonal boron nitride has a layer structure similar to that of graphite with a high polymer molecular bonding which is formed from a honeycomb network of covalent trivalent boron atoms and nitrogen atoms. In spite of the clearly reduced hardness of the hexagonal boron nitride, with a boron nitride outer layer composed of hexagonal and amorphous structure, in dry cutting significantly better cutting efficiencies and tool lives are achieved. Advantageously the low reactivity of the hexagonal or amorphous boron nitride is here advantageous.

The outer surface layer of hexagonal and/or amorphous boron nitride can either be coated directly of a hard metal cermet or ceramic base body or onto at least one hard facing layer applied to this base body and composed of carbides, nitrides or carbonitrides of at least of the elements titanium, zirconium or hafnium or aluminum oxide. The thickness of the outer boron nitride layer lies between 1 μm and 5 μm, preferably between 1 μm and 3 μm. With multilayer surface coatings, of which the last outer layer is comprised of hexagonal and amorphous boron nitride, the total thickness of the coating should not exceed 20 μm. Advantageously, at least 50% by volume of the outer boron nitride layer consists of hexagonal boron nitride. The boron nitride layer is so characterized that it has absorption lines of the infrared spectrum at the wave numbers 800 cm$^{-1}$ and 1400 cm$^{-1}$ (corresponding wavelengths of 77142 nm to 12500 nm).

As the substrate body upon which the hexagonal and amorphous boron nitride layer can be applied directly or via the intermediary of further hard material layers, preferably a hard metal is used which can be constituted by carbides of tungsten, titanium, niobium and/or tantalum and a cobalt binder or of a cermet of titanium carbonitride basis.

If one uses a CVD process for deposition of the hexagonal boron nitride, introduction of gaseous boron trichloride feed medium for boron makes high temperatures of greater than 1200° C. necessary to obtain a sufficient deposition rate but preferably the process is carried out in that temperatures between 400° C. and 900° C. are usable to obtain highly adhering dense boron nitride coatings. The deposited structure is fine crystalline and contains amorphous components which are detectable by X-ray analysis and electron microscopy. The hardness of the deposited layer is also surprising when compared to the hardness of hexagonal boron nitride since, upon deposition by the CVD process at high temperatures, it is significantly greater, namely, about 800 to 1000 Vickers hardness by comparison to 200 Vickers hardness.

The coefficient of sliding friction of the boron nitride surface is low. The use of the coating process by means of a plasma-activated CVD atmosphere can be carried out with boron trichloride, nitrogen, hydrogen and argon as the feed medium at temperatures which preferably lie between 500° C. and 800° C. and under pressures between 100 Pa and 1000 Pa around a substrate body or a previously coated substrate body. Preferably a process is used in which the plasma activation at the cathodically-connected tool base body is carried out by a pulsed direct current voltage with a residual voltage between pulses of a level which is equal to or greater than the lowest ionization potential of the gas used in the CVD process and at a maximum of 50% of the maximum value of the pulsed DC voltage. This process is described in detail in DE 38 41 731 C1 or EP 0 373 412 B1 to which reference can be made.

Special advantages are obtained in the use of the described cutting tool in the chip machining of metals without the is assistance of a cooling lubricant, i.e. in dry cutting.

SPECIFIC DESCRIPTION AND EXAMPLE

Initially commercially available turning cutting plates of the type DNMG 150612-15, coated on a multilayer coating of titanium nitride, titanium carbonitride and aluminum oxide are selected. The total thickness of the surface coating varies with the individual plate between 8 to 10 μm. With these cutting plates, transmission shafts with a maximum diameter of 35 mm and a length of 362 mm are machined from a steel composition CF 53 V on an automatic lathe. The cutting depth amounted to 2.5 mm with a feed of 0.4 mm per revolution and a maximum cutting speed of 200 m/min. With use of a cooling lubricant, 33 pieces can be produced with one cutting corner of the cutting tool. Without the use of a cooling lubricant, only 8 workpieces can be produced.

In a second test, turning cutting plates of the aforedescribed type are selected whose layer thickness is at the lower end of the tolerance range. These turning cutting plates are coated by the plasma-pulse-CVD process at a temperature of 709° C. and under a pressure of 280 Pa, in which a gas mixture of the following volume composition is used: 0.5% boron trichloride, 4.5% nitrogen, 65% hydrogen and 30% argon. After a reaction time of 140 minutes, a fixedly adherent boron nitride layer of hexagonal and amorphous configuration was obtained in a thickness of about 2 μm. These turning cutting plates were used in the same way as has been described without supply of a cooling lubricant, i.e. in a dry cutting. In four successive tests, with each cutting corner of the cutting tool, 25, 27, 24 and 25 parts were fabricated.

The foregoing results indicate that indeed the tool life or machining rates expected with use of a cooling lubricant cannot be achieved, but in dry cutting the cutting tool of the invention has significantly improved life. If one reflects that with the use of the cutting tool of the invention expensive handling and the supply of a cooling lubricant can be avoided, from the point of view of environmental protection and job protection, a significant technological and economical advance is obtained.

We claim:

1. A cutting tool for chip removal machining comprising of hard metal, cermet or ceramic substrate body, coated with a surface coating composed of both hexagonal and amorphous boron nitrides and wherein said surface coating includes an outermost boron nitride layer in a thickness between 1 and 5 μm, said surface coating having a total thickness which does not exceed 20 μm, at least 20 volume % of the outermost boron nitride layer being comprised of hexagonal boron nitride and the infrared spectrum of the outermost boron nitride layer having absorption lines at wave numbers of 800 to 1400 cm$^{-1}$.

2. The cutting tool according to claim 1 wherein said body has a multilayer surface coating of carbides, nitrides or carbonitrides of at least one of titanium, zirconium or hafnium, or aluminum oxide, the outermost layer being deposited from hexagonal and amorphous boron nitride.

3. The cutting tool according to claim 1 wherein the substrate body is comprised of carbides of tungsten, titanium, niobium or tantalum and a cobalt binder or is constituted of a titanium carbonitride based cermet.

4. The cutting tool according to claim 1 wherein the outermost boron nitride layer has a thickness of 1 μm to 3 μm.

* * * * *